(12) United States Patent
Giaume et al.

(10) Patent No.: US 6,775,797 B2
(45) Date of Patent: Aug. 10, 2004

(54) METHOD OF TESTING AN INTEGRATED CIRCUIT HAVING A FLEXIBLE TIMING CONTROL

(75) Inventors: Olivier Giaume, Biot (FR); Christelle Faucon, Plascassier (FR); Beatrice Brochier, Mougins (FR); Philippe Alves, Cannes (FR); Christian Ponte, La Colle sur Loup (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 516 days.

(21) Appl. No.: 09/923,612

(22) Filed: Aug. 7, 2001

(65) Prior Publication Data

US 2002/0049940 A1 Apr. 25, 2002

(30) Foreign Application Priority Data

Aug. 8, 2000 (FR) .......................................... 00 10441

(51) Int. Cl.[7] ................ G01R 31/3177; G01R 31/3181; G01R 31/3185
(52) U.S. Cl. ..................................................... 714/731
(58) Field of Search ........................................ 714/731

(56) References Cited

U.S. PATENT DOCUMENTS 5,812,562 A    9/1998   Baeg ...................... 371/22.31

FOREIGN PATENT DOCUMENTS

JP          01079673 A  *  3/1989  ........... G01R/31/28
JP          2000028663 A  *  1/2000  ........... G01R/31/00

OTHER PUBLICATIONS

Epo Form 1503 03 08 "Documents Consideres Comme Pertinents" Dec. 5, 2001: part of the file wrapper of European Patent Application EP 01 20 2908; The Hague, Netherlands.

* cited by examiner

Primary Examiner—R. Stephen Dildine
(74) Attorney, Agent, or Firm—Michael J. Ure

(57) ABSTRACT

The invention relates to a method of testing an integrated circuit comprising memory cells arranged around a core whose clock input is subjected to a conditional inhibition in the test mode.

Figure 1:
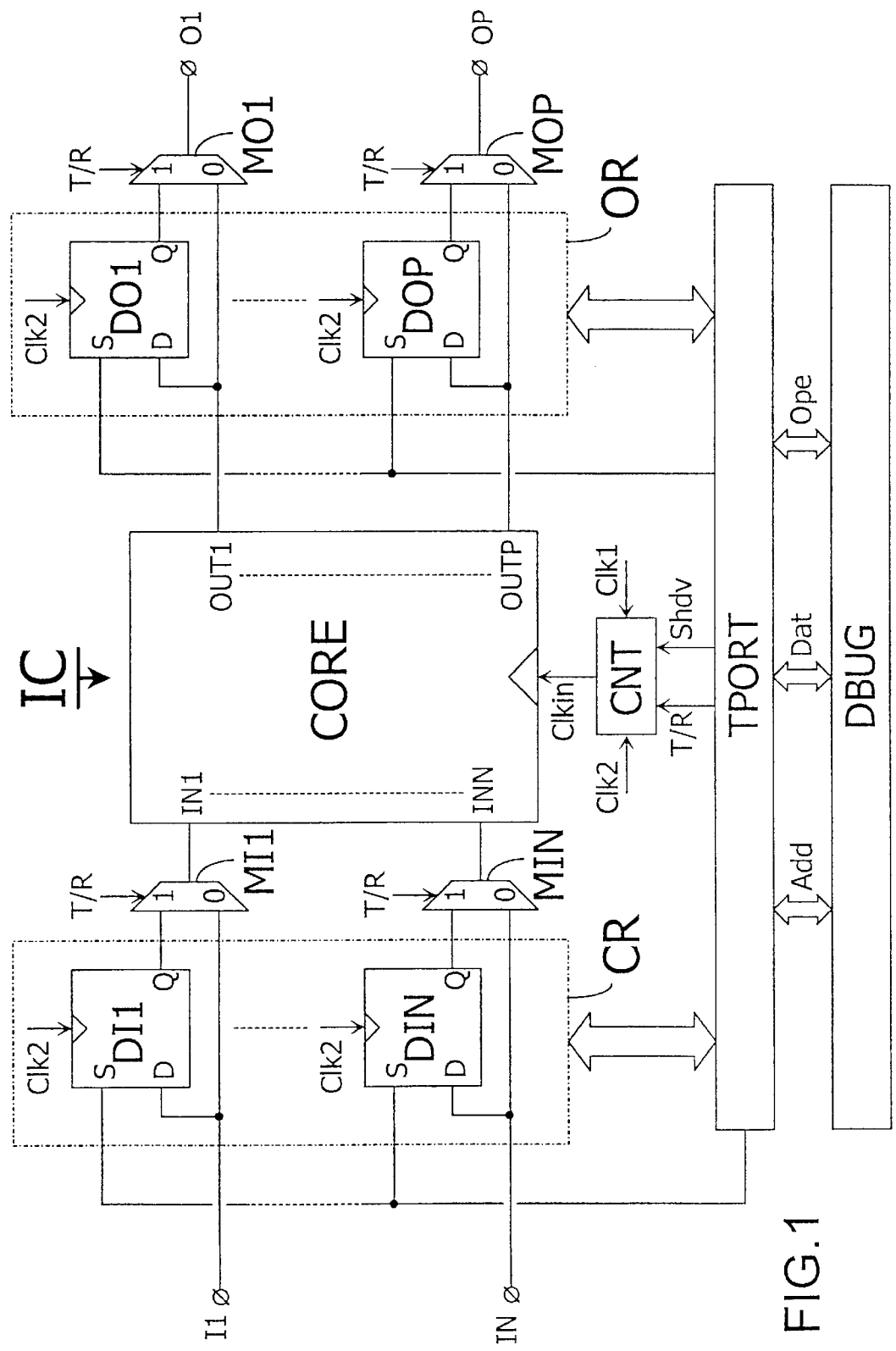

The method in accordance with the invention includes the following steps:
 configuration of the circuit in the test mode (T/R=1, TM, En=0),
 selection of a virtual address (Sel(DV)),
 canceling the inhibition (En=1) of the clock input of the core following said selection.

The invention enables to transfer to the core enough clock pulses to allow the core to properly achieve the operating sequence that it should emulate, without resorting to prior storage of the number of pulses necessary for this operating sequence.

The inhibition of the clock input of the core can be controlled by means of JTAG-compliant series of instructions. Application: Validation of the functioning of integrated circuits.

8 Claims, 3 Drawing Sheets

METHOD OF TESTING AN INTEGRATED CIRCUIT HAVING A FLEXIBLE TIMING CONTROL

The invention relates to a method of testing an integrated circuit comprising a core and a plurality of memory cells having outputs and inputs which are alternately connected to inputs and outputs of the core, said core being provided with a clock input intended to receive a first clock signal in a standard mode of operation, each memory cell being identified by an address and provided with a clock input intended to receive a second clock signal in a test mode, said clock input of the core being subjected to a conditional inhibition in the test mode.

Such a method is described in U.S. Pat. No. 5,812,562. In accordance with the known method, the memory cells whose outputs are connected to the inputs of the core form a first test register, called control register, while the memory cells whose inputs are connected to the outputs of the core form a second test register, called observation register. Write access or read access from outside the integrated circuit to an i-order bit of one of the two registers is obtained, for example, by means of (i+1) shifts to the right of the content of the register. The address of the $i^{th}$ memory cell included in the register will thus be selected, which address serves to determine the number of shifts to which the register will be subjected.

When the integrated circuit is in the test mode, the clock input of the core is a priori inhibited and the core is in an idle state.

Testing a given operating sequence generally takes place in three stages:

In a first phase, called charging phase, the control register receives information from an external source, representing stimuli to be applied to the core so as to emulate a certain operating sequence. These stimuli simulate the environment to which the core will be subjected in case it would be ordered to execute said sequence in the standard operating mode. Such charging of the control register is clocked by means of the second clock signal. In a second stage, called emulation stage, the core must be restarted by means of a clock signal so as to enable to observe its responses to the stimuli present in the control register. In accordance with the known method, such a clock signal consists of a succession of pulses, the number of pulses being predetermined and stored in a clock register added to the control register, said two registers being simultaneously programmed during the charging phase associated with the test of each operating sequence, the number of pulses necessary for the core to complete each sequence being specific to said sequence.

The inhibition of the clock input of the core is then canceled and the core receives the number of clock pulses necessary to carry through the chosen operating sequence.

After said emulation phase, the observation register stores the signals present at the outputs of the core.

In a third phase, called validation phase, the value of the content of the observation register is compared with a digital reference value, which is representative of the response the core should supply in reaction to the stimuli received. In the case of identity between these values, it will be concluded that the core has correctly executed the chosen operating sequence.

The number of clock pulses necessary to emulate an operating sequence varies from sequence to sequence. Thus, the clock register should be of considerable size so as to be suitable for long operating sequences requiring a large number of clock pulses.

In the known method, the size of the clock register is of the order of 50% of the size of the control register. As these registers are charged bit by bit in accordance with a serial mode, the utilization of a clock register to generate clock pulses in the test mode causes an increase of the duration of the charging phase by 50%, and of the duration of the whole test of an operating sequence by 30 to 50%, depending on the duration of the emulation phase and the size of the observation register. Such an increase of the duration of the test according to the known method causes the production output to be reduced and the overall production cost of the integrated circuit to be increased considerably.

In addition, as the dimensions of the clock register are definitively fixed in the design stage of the integrated circuit, a large silicon surface must be used in order to be able to store the number of clock pulses in the test mode.

Moreover, an up-down counter must be used to check the number of clock pulses sent to the core, leading to a further increase in size of the surface of the integrated circuit wherein the known method is implemented.

It is an object of the invention to overcome these drawbacks by providing a method of testing an integrated circuit wherein the process of transferring clock pulses to the core in the test mode is carried out in a simple and flexible manner, without programming, inside a specific register, of a number of pulses specific to each operating sequence being necessary.

In accordance with the invention, a method as described in the opening paragraph comprises the following stages:

configuration of the circuit in the test mode, selection of a so-called virtual address, which does not correspond to any memory cell, canceling the inhibition of the clock input of the core for a predetermined period of time following said selection.

In accordance with this method, mere selection of a virtual address causes the transmission of a clock pulse to the clock input of the core. N successive selections of a virtual address enable a series of N clock pulses to be transferred to the core. Thus, pre-programming this number N in a register is no longer necessary, rendering the method in accordance with the invention very flexible, and resulting in savings regarding the silicon surface and the cost of production of the integrated circuit.

In a special embodiment in accordance with the invention, the clock input of the core receives the second clock signal when the inhibition of said clock input is canceled in the test mode.

Such an embodiment enables the integrated circuit to be clocked by means of the same second clock signal throughout the duration of the test mode, thereby avoiding clock switching which always turns out to be difficult to control.

In a variant of the invention, canceling the inhibition of the clock input of the core is additionally subject to the execution of an operation relative to the virtual address.

In accordance with this variant of the invention, the selection of a virtual address announces the forthcoming cancellation of the inhibition of the clock input, the duration of said cancellation of the inhibition, and hence the number of clock pulses transmitted to the core, being determined by the number of operations carried out with respect to said virtual address.

In an advantageous embodiment of this variant, canceling the inhibition of the clock input of the core is additionally subject to the execution of a predetermined specific operation relative to the virtual address.

In accordance with this embodiment, rather than detect every operation relative to a virtual address, it is sufficient to detect one specific operation, which leads to a simplification of the physical implementation of this phase, and hence to a reduction of its cost.

In a preferred embodiment of this variant, this predetermined specific operation is a shifting operation.

The choice of a shifting operation as a necessary condition for canceling the inhibition enables to use a series of instructions in accordance with the JTAG standard to control the transfer of a clock pulse to the core in the test mode.

In one of its embodiments, the invention also relates to an integrated circuit comprising:
- a core provided with a clock input intended to receive a first clock signal in a standard operating mode,
- a plurality of memory cells having outputs and inputs which are alternately connected to inputs and outputs of the core, each memory cell being identified by an address and provided with a clock input intended to receive a second clock signal in a test mode,
- a control module intended to carry out an inhibition of the clock input of the core in the test mode, said control module being designed such that said inhibition will be canceled for a predetermined period of time after a virtual address, which does not correspond to any memory cell, has been selected.

In a variant of this embodiment, the control module is configured so as to transfer the second clock signal towards the clock input of the core when the inhibition of said input is canceled during the test mode.

In another variant of this embodiment, canceling the inhibition of the clock input of the core during the test mode is additionally subject to the execution of an operation relative to the virtual address.

Figure 2B:
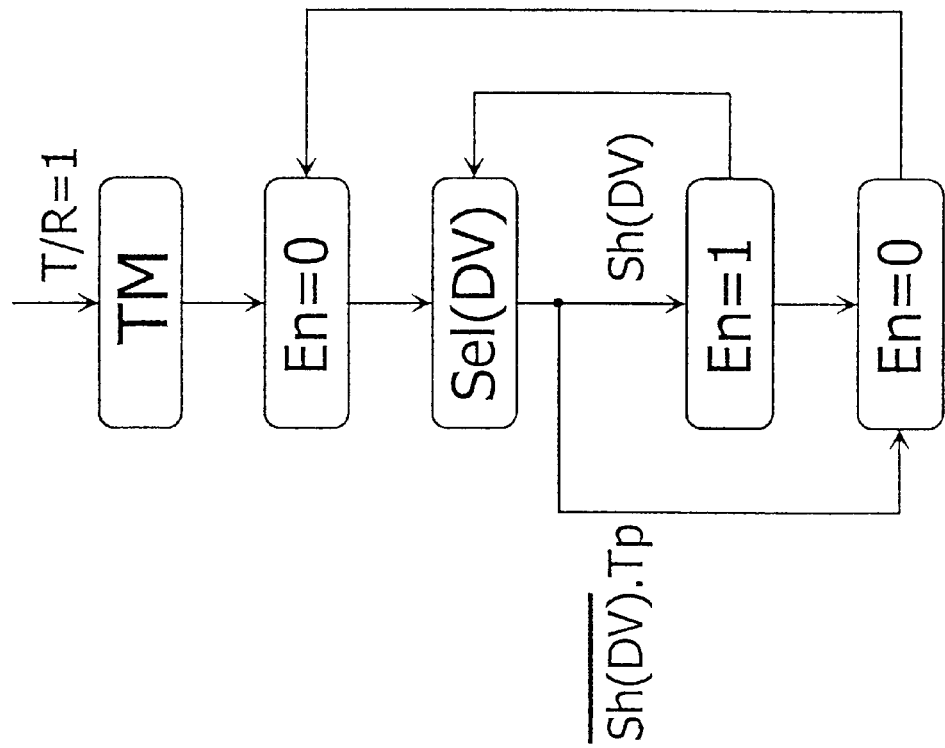
Figure 2A:
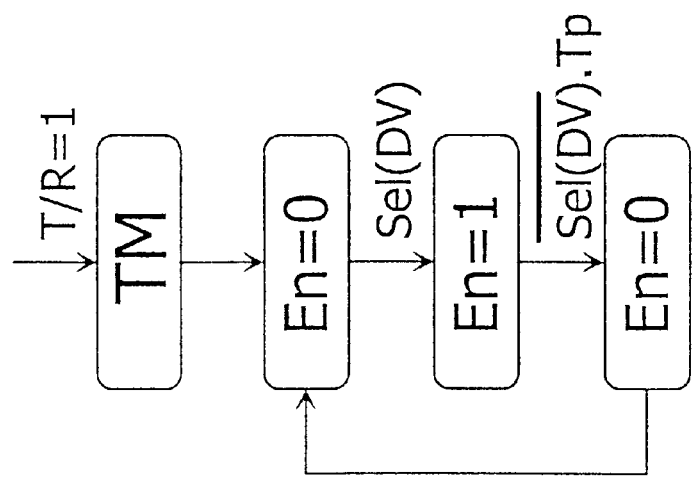
Figure 3:
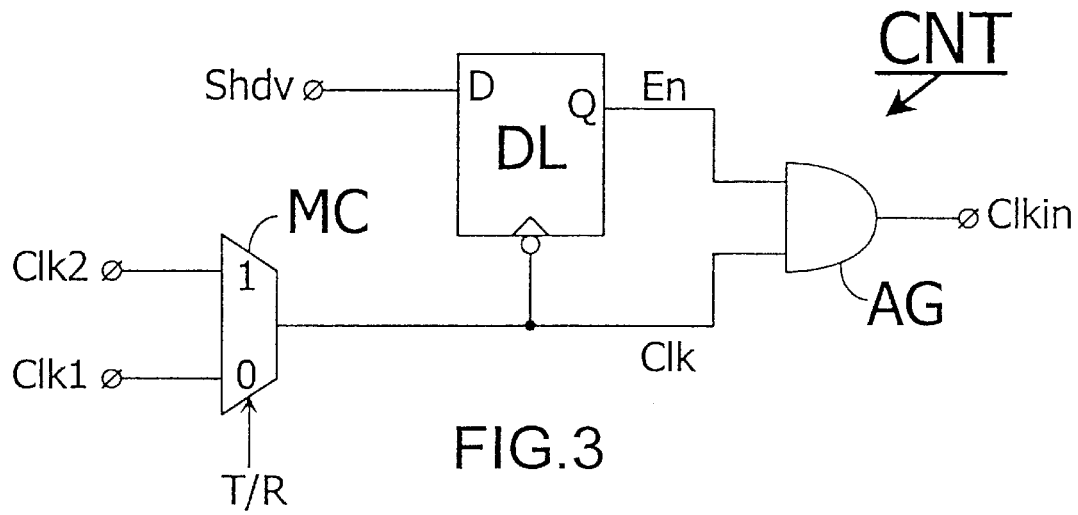
Figure 4:
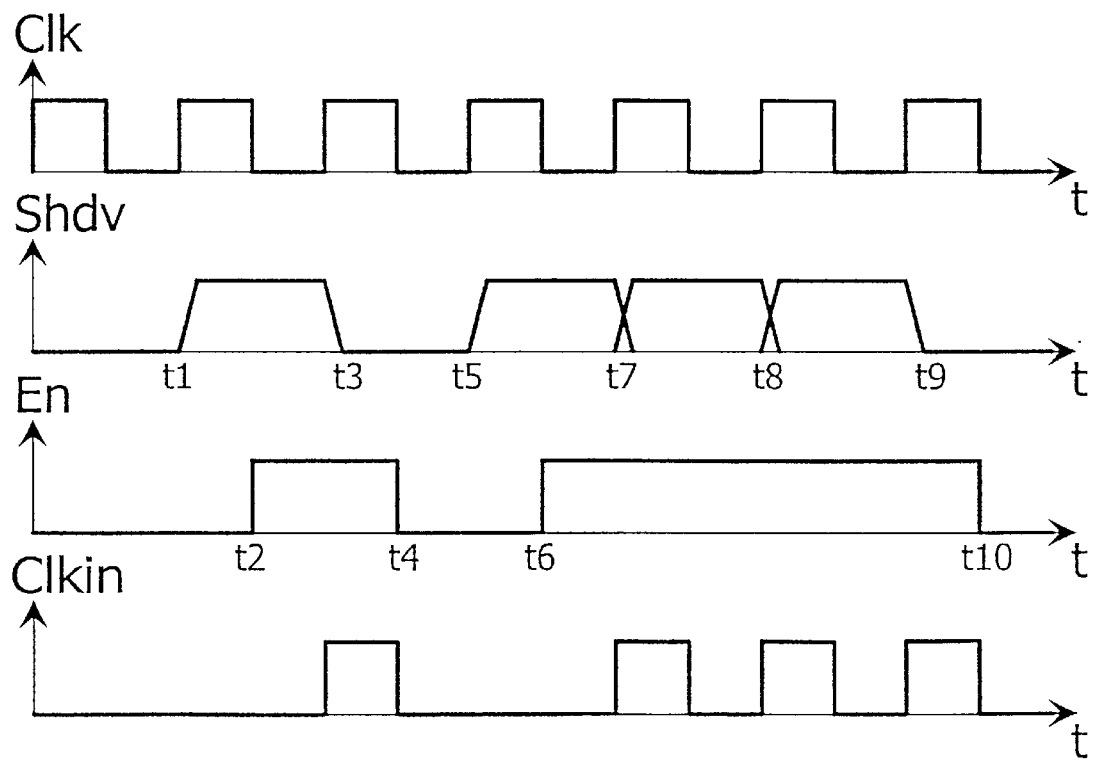

These and other aspects of the invention will be apparent from and elucidated with reference to the non-limitative exemplary embodiment described in the drawings, wherein:

FIG. 1 is a functional diagram of an integrated circuit in accordance with an embodiment of the invention, FIGS. 2A and 2B are flow charts showing the inhibition/inhibition-canceling sequences included in methods in accordance with the invention and in accordance with one of the variants, respectively, FIG. 3 is a functional diagram of a module for the conditional inhibition of the clock input of the core, and FIG. 4 shows an assembly of timing diagrams representing the evolution of signals present in said module.

FIG. 1 diagrammatically shows an integrated circuit IC wherein the invention is implemented. This integrated circuit IC comprises:
- a core CORE provided with a clock input intended to receive a first clock signal Clk1 in the standard operating mode,
- a plurality of memory cells DIi (where i=1 to N) and DOj (where j=1 to P) having outputs Q and inputs D which are alternately connected to inputs INi (where i=1 to N) and outputs OUTj (where j=1 to P) of the core CORE via multiplexers MIi (where i=1 to N) and MOj (where j=1 to P), each memory cell being identified by an address and provided with a clock input intended to receive a second clock signal Clk2 in the test mode,
- a control module CNT intended to inhibit the clock input of the core CORE in the test mode, which control module is designed such that said inhibition is canceled for a predetermined period of time after a detection signal Shdv has been activated.

In this integrated circuit, the memory cells DIi (where i=1 to N) and DOj (where j=1 to P) take the form of flip-flops D and form, respectively, a control register CR and an observation register OR. These registers are connected to a serial port TPORT intended to exchange information regarding addresses Add, data Dat and operations Ope with a test machine DBUG, which is generally external to the integrated circuit IC, and which machine drives all the test operations described herein.

In accordance with the embodiment chosen, the detection signal Shdv will be activated by the machine DBUG when said machine has ordered either a selection of a virtual address or an operation, for example a shifting operation, relative to said address.

When the integrated circuit is in the standard operating mode, a control signal T/R of the multiplexers MIi (where i=1 to N) and MOj (where j=1 to P) is in the inactive state, for example logic level 0, as a result of which the inputs INi (where i=1 to N) and the outputs OUTj (where j=1 to P) of the core CORE are connected, respectively, to the inputs Ii (where i=1 to N) and the outputs Oj (where j=1 to P) of the integrated circuit IC.

When the integrated circuit is in the test mode, the control signal T/R is in the active state, for example logic level 1, and the inputs INi (where i=1 to N) and the outputs OUTj (where j=1 to P) of the core CORE are connected, respectively, to the outputs of the memory cells DIi (where i=1 to N) and the inputs of the memory cells DOj (where j=1 to P).

As the clock input of the core CORE is a priori inhibited in the test mode, the core CORE is in an idle state.

The test of a given operating sequence generally occurs in three stages:

In a first phase, called charging phase, the machine DBUG writes information in the control register CR, which information represents stimuli to be applied to the core CORE so as to emulate a given operating sequence thereof. Such a charging operation is clocked by means of the second clock signal Clk2, while the necessary number of shifts of the content of the observation register is obtained by means of a shift signal S which is simultaneously applied to all memory cells forming the observation register OR.

In a second phase, called emulation phase, the core CORE is restarted by means of a clock signal, so as to enable to observe its responses to the stimuli present in the control register CR. The inhibition of the clock input of the core is then canceled by the control module CNT, and the core CORE receives the number of clock pulses required to carry through the chosen operating sequence. In the embodiment described here, a clock pulse is transmitted to the core each time a shifting operation is ordered by the machine DBUG in connection with a virtual address which does not correspond to any memory cell. Such an event is identified by an active state of the detection signal Shdv transmitted by the serial port TPORT to the control module CNT.

After this emulation phase, the observation register OR stores the signals present at the outputs OUTj (where j=1 to P) of the core CORE.

In a third phase, called validation phase, the value of the content of the observation register OR is compared by the machine DBUG with a digital reference value, representative of the response the core CORE should have supplied in reaction to the stimuli received. In case of identity between these values, it will be concluded that the core CORE has correctly executed the chosen operating sequence.

In certain cases, the control registers CR and the observation registers OR exchange roles. For example, if it is desirable to test a peripheral device, not shown in the drawing, such as a RAM memory bank, it is the observation register OR that contains stimuli simulating orders originating from the core CORE, in response to which the peripheral device issues signals towards the core CORE, which signals are then stored by the control register CR in order to be validated by the machine DBUG.

This explains why the inputs D of the memory cells DIi (where i=1 to N) and the outputs Q of the memory cells DOj (where j=1 to P) are connected, respectively, to the inputs Ii (where i=1 to N) and the outputs Oj (where j=1 to P) of the integrated circuit IC although the write/read operations of the control or observation registers CR and OR, respectively, take place, a priori, in the serial mode of operation via the serial port TPORT.

FIG. 2A shows an inhibition/inhibition-canceling sequence implemented by the control module in accordance with the invention. In this sequence, the integrated circuit is configured in the test mode during a first stage TM by means of the signal T/R, which then switches to the active state, in this case logic level 1. The clock input of the core is immediately inhibited by putting an enabling signal En in the inactive state, here logic level 0. If a virtual address DV, which does not correspond to any of the memory cells, is selected by the machine DBUG via the serial port, the enabling signal En is put in the active state: En=1. Otherwise, the enabling signal remains in the inactive state. If, after a period of time Tp—which is advantageously chosen to be equal to a period of the clock signal transferred to the clock input of the core during the emulation phase, so that a single clock pulse will reach the core for each selection of a virtual address DV—no new selection Sel (DV) of a virtual address DV has occurred, the enabling signal will again be put in the inactive state: En=0. In the opposite case, the enabling signal will remain in the active state, i.e. En=1, thereby enabling a further clock pulse to be transmitted to the core.

Thus, each selection Sel(DV) of a virtual address DV causes the transmission of a clock pulse to the core.

FIG. 2B shows an inhibition/inhibition-canceling sequence implemented by the control module in accordance with a variant of the invention. In this sequence, the integrated circuit is configured in the test mode during a first step TM by means of the signal T/R, which then switches to the active state, here logic level 1. The clock input of the core is immediately inhibited by putting an enabling signal En in the inactive state, here logic level 0. If a virtual address DV, which does not correspond to any of the memory cells, is selected by the machine DBUG via the serial port, the sequence is in a waiting stage Sel(DV). If, during said waiting stage, a shift operation Sh(DV) relative to the virtual address DV is ordered by the machine DBUG, the enabling signal En is put in the active state: En=1. Otherwise, the enabling signal remains in the inactive state. If, after a period of time Tp—which is advantageously chosen to be equal to a period of the clock signal transferred to the clock input of the core during the emulation phase, so that a single clock pulse reaches the core for each shift operation Sh(DV) relative to a virtual address DV—no new shift Sh(DV) has been ordered, the enabling signal En will again be put in the inactive state: En=0. In the opposite case, the enabling signal remains in the active state, i.e. En=1, thereby enabling the transmission of a further clock pulse to the core.

Thus, each shift operation Sh(DV) relative to a virtual address DV causes the transmission of a clock pulse to the core.

This variant of the invention fully exploits the format of the sequences in accordance with the JTAG standard (Joint Test Action Group), according to which the selection of an address must be followed by one or more shift operations with respect to said address.

By virtue of the invention, a JTAG-compliant machine DBUG thus can readily drive pulses, in a software-controlled manner, to the core during the emulation phase without said machine having to be modified for this purpose.

FIG. 3 diagrammatically shows a possible embodiment of the control module CNT. In this example, the control module CNT comprises an AND-gate AG an output of which will be connected to the clock input of the core so as to supply the latter with a clock signal Clkin, a clock signal Clk being supplied to an input of the AND-gate AG, the enabling signal En being supplied to another input of said AND-gate AG.

An inactive state of this signal En, i.e. logic level 0 in this example, thus orders the inhibition of the clock input of the core, and an active state of the enabling signal En, i.e. logic level 1 in this example, orders the inhibition of the clock input of the core to be canceled.

The control module CNT additionally comprises a memory cell DL, formed in this case by means of a D-latch, a data input D of which receives the detection signal Shdv, a data output Q of which delivers the enabling signal En, and a clock input of which receives the inverse of the clock signal Clk.

The control module CNT additionally comprises a multiplexer MC which enables to choose, in this example by means of the control signal T/R, which one of the first and second clock signals Clk1 and Clk2 is to form the clock signal Clk, the active edges of which will be transmitted to the core. In the present case, the core receives the first clock signal Clk1 when the control signal T/R is inactive, i.e. at logic level 0, in the normal mode of operation, and the second clock signal Clk2 when the control signal T/R is active, i.e. at logic level 1, in the test mode, provided that the enabling signal En is also active.

FIG. 4 shows the development of the signals present in the control module described hereinabove. In a first stage corresponding, for example, to a charging phase, the enabling signal En is inactive and the clock input of the core is inhibited. At an instant t1, the detection signal Shdv is activated, and remains active until an instant t2. Said active state, which is representative of a selection of a virtual address or an operation relative to such an address, depending on the chosen embodiment of the invention, is stored by the D-latch DL at an instant t2 corresponding to the falling edge of the clock signal Clk following the instant t1. The enabling signal En is then activated and causes the inhibition of the clock input of the core to be canceled. The detection signal Shdv is deactivated at a following instant t3, but this deactivation does not influence the enabling signal En. The enabling signal En remains active at least until an instant t4 corresponding to the next falling edge of the clock signal Clk, i.e. during a period Tp equal to a period of said signal Clk. During said period, the clock signal Clk will have demonstrated an active edge, in this case at the instant t3, which will have been transmitted to the core by the signal Clkin. At the instant t4, at which the detection signal Shdv will not have been reactivated, the enabling signal En is deactivated and the clock input of the core is inhibited again. It clearly emerges from this sequence that what corresponds to a selection of a virtual address or to an operation with respect to said address, depending on the chosen embodiment of the invention, is the transmission of a clock pulse to the core.

At an instant t5, the detection signal Shdv is reactivated, thereby causing the enabling signal En to be activated at an instant t6 corresponding to the falling edge of the clock signal Clk which follows the instant t5. The detection signal Shdv is successively reactivated at the consecutive instants t7 and t8, and deactivated at an instant t9. In this case, the Figure shows three successive selections of a virtual address, or three successive operations relating to a virtual address, depending on the chosen embodiment of the invention. The enabling signal En is thus activated during three successive periods of the clock signal Clk, thereby enabling the transmission to the core of three clock pulses by the signal Clkin, since the inhibition controlled by the enabling signal is canceled. At an instant t10, at which the detection signal Shdv has not been reactivated, the enabling signal En is deactivated and the clock input of the core is inhibited again. It clearly emerges from this sequence that what corresponds to N successive selections of a virtual address or N successive operations regarding such an address, depending on the chosen embodiment of the invention, is the transmission of N clock pulses to the core.

The invention thus enables clock pluses to be transferred in a simple and flexible manner in the test mode, without any prior programming of the number of pulses specific to the operating sequence tested being necessary.

What is claimed is:

1. A method of testing an integrated circuit comprising a core and a plurality of memory cells having outputs and inputs which are alternately connected to inputs and outputs of the core, said core being provided with a clock input intended to receive a first clock signal in a standard mode of operation, each memory cell being identified by an address and provided with a clock input intended to receive a second clock signal in a test mode, said clock input of the core being subjected to a conditional inhibition in the test mode, which method comprises the following steps:

configuration of the circuit in the test mode, selection of a so-called virtual address, which does not correspond to any memory cell, canceling the inhibition of the clock input of the core for a predetermined period of time following said selection.

2. A method as claimed in claim 1, wherein the clock input of the core receives the second clock signal when the inhibition of said clock input is canceled in the test mode.

3. A method as claimed in claim 1, wherein canceling the inhibition of the clock input of the core is additionally subject to the execution of an operation relative to the virtual address.

4. A method as claimed in claim 1, wherein canceling the inhibition of the clock input of the core is additionally subject to the execution of a predetermined specific operation relative to the virtual address.

5. A method as claimed in claim 4, wherein the predetermined specific operation is a shifting operation.

6. An integrated circuit comprising:

a core provided with a clock input intended to receive a first clock signal in a standard operating mode, a plurality of memory cells having outputs and inputs which are alternately connected to inputs and outputs of the core, each memory cell being identified by an address and provided with a clock input intended to receive a second clock signal in a test mode, a control module intended to inhibit the clock input of the core in the test mode, said control module being designed such that said inhibition is canceled for a predetermined period of time after a virtual address, which does not correspond to any memory cell, has been selected.

7. An integrated circuit as claimed in claim 6, wherein the control module is configured so as to transfer the second clock signal towards the clock input of the core when the inhibition of said input is canceled during the test mode.

8. An integrated circuit as claimed in claim 6, wherein canceling the inhibition of the clock input of the core during the test mode is additionally subject to the execution of an operation relative to the virtual address.

* * * * *